United States Patent [19]
Ye et al.

[11] Patent Number: 5,710,486
[45] Date of Patent: Jan. 20, 1998

[54] INDUCTIVELY AND MULTI-CAPACITIVELY COUPLED PLASMA REACTOR

[75] Inventors: Yan Ye, Campbell; Hiroji Hanawa, Sunnyvale; Diana Xiaobing Ma, Saratoga; Gerald Zheyao Yin, Cupertino, all of Calif.

[73] Assignee: Applied Materials, Inc., Santa Clara, Calif.

[21] Appl. No.: 436,513

[22] Filed: May 8, 1995

[51] Int. Cl.$^6$ ................................................ H01J 7/24
[52] U.S. Cl. .......................... 315/111.21; 315/111.51
[58] Field of Search .................. 315/111.21; 51/111.51

[56] References Cited

U.S. PATENT DOCUMENTS

| | | | |
|---|---|---|---|
| 5,140,223 | 8/1992 | Gesche et al. | 315/111.21 |
| 5,146,137 | 9/1992 | Gesche et al. | 315/111.21 |
| 5,436,528 | 7/1995 | Paranjpe | 315/111.51 |

FOREIGN PATENT DOCUMENTS

| | | | |
|---|---|---|---|
| 3104780 | 5/1991 | Japan | 315/111.21 |
| 5021193 | 1/1993 | Japan | 315/111.21 |
| 9110341 | 7/1991 | WIPO | 315/111.21 |

*Primary Examiner*—Robert Pascal
*Assistant Examiner*—Michael Shingleton
*Attorney, Agent, or Firm*—Michaelson & Wallace

[57] ABSTRACT

The invention is embodiment in a plasma reactor for processing a semiconductor wafer, the reactor having a pair of parallel capacitive electrodes at the ceiling and base of the processing chamber, respectively, each of the capacitive electrodes capacitvely coupling RF power into the chamber in accordance with a certain RF phase relationship between the pair of electrodes during processing of the semiconductor wafer for ease of plasma ignition and precise control of plasma ion energy and process reproducibility, and an inductive coil wound around a portion of the chamber and inductively coupling RF power into the chamber for independent control of plasma ion density. Preferably, in order to minimize the number of RF sources while providing independent power control, the invention includes power splitting to separately provide power from a common source or sources to the pair of electrodes and to the coil.

31 Claims, 5 Drawing Sheets

INDUCTIVELY AND MULTI-CAPACITIVELY COUPLED PLASMA REACTOR

BACKGROUND OF THE INVENTION

1. Technical Field

The invention is related to radio frequency (RF) plasma reactors for processing semiconductor wafers.

2. Background of the Invention

A conventional parallel plate plasma reactor of the type illustrated in the highly simplified diagram of FIG. 1 includes a vacuum chamber 10 having a side wall 12 and top and bottom parallel insulated capacitor electrodes 14, and 16. The side wall 12 may be grounded and is isolated from both electrodes 14, or 16 if they are both RF-powered. Alternatively, if one of the electrodes 14, or 16 is grounded then it is also connected to the side wall 12 while the other electrode is RF-powered. Typically, one of the electrodes 14, or 16 is connected through an RF impedance match network 18 to an RF power generator 20 while the other electrode is grounded and connected to the side wall 12. A semiconductor wafer 22 is placed in the chamber 10 and a processing gas is introduced into the chamber. The RF power applied across the pair of electrodes 14, and 16 ignites a plasma in the chamber 10 and maintains the plasma by capacitive coupling.

The parallel plate plasma reactor of FIG. 1 enjoys several distinct advantages. Specifically, the large area and closeness of the parallel electrodes 14, and 16 readily ignites the plasma and permit precise control of the capacitive coupling and plasma ion energy at the wafer 22. The plasma processing of such a reactor is highly reproducible in comparison with other types of plasma reactors. One disadvantage of the parallel plate plasma reactor is that RF energy is coupled to the plasma through capacitive coupling almost exclusively, so that plasma ion density can be increased or decreased only by increasing or decreasing capacitively coupled RF power. However, such a power increase increases ion bombardment energy, resulting in greater device damage on the wafer. Thus, plasma density in such a reactor is limited by the plasma ion energy threshold at which device damage becomes significant.

An inductively coupled plasma reactor of the type illustrated in FIG. 2 has a vacuum chamber 30 surrounded by a coil inductor 32. A semiconductor wafer 34 is supported inside the chamber 30 on a wafer pedestal 36. The coil inductor 32 is connected to an RF power generator 38 through an RF impedance match network 40. A processing gas is introduced into the interior of the chamber 30 and RF power inductively coupled from the coil 32 ignites and maintains a plasma within the chamber 30. Plasma ion density is readily increased by increasing the RF power applied to the coil inductor 32. However, such an increase in applied RF power on the inductor 32 does not concomitantly increase the energy of ions impinging on the wafer surface. Thus, plasma density can be increased to a much greater extent than in the reactor of FIG. 1 without risking device damage due to excessive plasma ion energy, a significant advantage.

One problem with the inductively coupled plasma reactor of FIG. 2 is that the inductor coil 32 provides little or no control of plasma ion energy, and therefore a separate apparatus for providing such control must be provided. This problem is conventionally solved by applying RF power to the wafer pedestal 36 from a capacitively coupled independent RF power generator 42 through an RF impedance match network 44. The RF power generator 42, controlling plasma ion energy, may be adjusted independently of the RF power generator 38 controlling plasma ion density, so that plasma ion energy control and plasma ion density control are decoupled.

However, the bias RF power applied to the wafer pedestal 36 provides inferior control over plasma ion energy and provides inferior process reproducibility (in comparison with the parallel plate plasma reactor of FIG. 1), a significant problem. Another problem is that the inductively coupled reactor of FIG. 2 does not ignite a plasma as readily as the capacitively coupled reactor of FIG. 1.

It has not seemed possible to realize the disparate advantages of both the capacitively coupled plasma reactor of FIG. 1 and the inductively coupled plasma reactor of FIG. 2 in the same reactor, due to the seemingly conflicting structural features required for realizing the different advantages.

It is an object of the present invention to provide all of the advantages of both the capacitively coupled reactor of FIG. 1 and the inductively coupled reactor of FIG. 2 in a single plasma reactor in a reactor.

It is a further object of the present invention to employ RF power-splitting to deliver both inductively coupled and capacitive coupled RF power into the process chamber with a minimum number of RF generators and in a well-controlled fashion.

It is another object of the present invention to provide all of the advantages of both the capacitively coupled reactor of FIG. 1 and the inductively coupled reactor of FIG. 2 in a single plasma reactor in a reactor in which contaminant deposits on the interior surface of the ceiling are sputtered away to keep the ceiling clean.

It is yet another object of the present invention to provide a way of sputtering material from the chamber ceiling to supply processing species into the chamber.

SUMMARY OF THE DISCLOSURE

The invention is embodied in a plasma reactor for processing a semiconductor wafer, the reactor having a pair of parallel capacitive electrodes at the ceiling and base of the processing chamber, respectively, each of the capacitive electrodes capacitively coupling RF power into the chamber, and an inductive coil wound around a portion of the chamber and inductively coupling RF power into the chamber in accordance with a certain RF phase relationship between RF signals applied to at least two of the following three elements: the two electrodes and the coil, the capacitive and inductive coupling being carried out during processing of the semiconductor wafer for ease of plasma ignition and precise control of plasma ion energy and process reproducibility. In one embodiment, the certain phase relationship between the two signals may be, for example, 180 degrees out of phase.

Preferably, in order to minimize the number of RF sources while providing independent power control, the invention includes power splitting to separately provide power from a common source or sources to the pair of electrodes and to the coil. Specifically, power is reactively split between at least two of the three elements constituting the coil and the pair of electrodes. The power may be inductively split through either a coil or transformer or may be capacitively split by a set of capacitors having a common electrode connected to a common RF source.

The RF power may be inductively split through a transformer and the pair of electrodes are connected to opposite sides of the secondary winding of the transformer. In this case, the inductive coil may be separately powered. Alternatively, both the inductive coil and the electrodes are connected to certain taps on the secondary winding of the transformer. As yet another alternative, the RF power may be inductively split through the inductive coil itself. For example, the power splitting may be carried out by tapping either one or both of the pair of electrodes to one winding of the inductive coil.

Preferably, the top electrode is sufficiently close to the ceiling and has sufficient RF power applied thereto to sputter contaminant deposits off of the ceiling to keep it clean.

In one embodiment, the chamber ceiling includes a portion consisting of a precursor material for a processing gas which is sputtered into the plasma under the influence of the capacitive electrode at the ceiling. The ceiling may be a multi-radius dome shape while the coil inductor may be conformal or non-conformal with the dome-shaped ceiling.

Preferably, the bottom capacitive electrode is the wafer pedestal while the top capacitive electrode is either inside the chamber or else is outside of the chamber. If the top electrode is inside the chamber, then it may be an integral part of the ceiling.

DETAILED DESCRIPTION OF THE PREFERRED EMBODIMENTS

Figure 3:
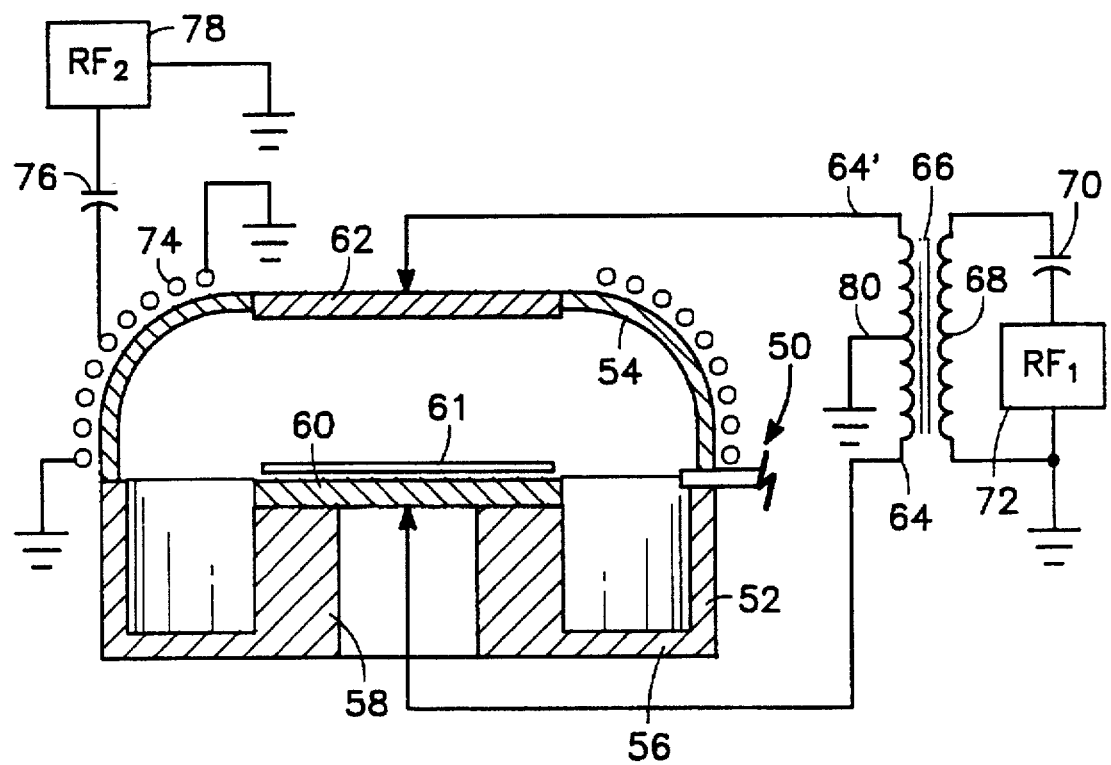
FIG. 3 is a diagram of a first embodiment of the invention employing inductive RF power splitting.

Referring to FIG. 3, a plasma reactor has a vacuum chamber including a cylindrical side wall 52 and a dome-shaped ceiling 54. A floor 56 supports a pedestal 58 which includes a bottom insulated capacitive electrode 60 supporting a semiconductor wafer 61 to be processed by the reactor. The ceiling 54 includes a top insulated capacitive electrode 62 facing the bottom capacitive electrode 60. The top and bottom capacitive electrodes 62, 60 are balanced on opposite sides of the secondary winding 64 of a transformer 66 whose primary winding 68 is connected through a capacitor 70 to an RF power source 72. The RF power source 72 includes an RF power generator and a 10 conventional impedance match network (not shown), such as the RF generator 20 and match network 18 of FIG. 1. The RF power source 72 controls the plasma ion energy and capacitive coupling to the plasma. Inductive coupling is provided by an inductive coil 74 wound around a portion of the dome shaped ceiling 54. The coil 74 is powered through a capacitor 76 by a second RF power source 78, including an RF generator and an RF impedance match network (not shown). The power source 78 is connected through the capacitor 76 to the middle winding of the inductor coil 72, the two ends of the coil 74 being grounded to minimize power loss to either the top electrode 72 or the side wall 52.

Apportionment of RF power between the top and bottom electrodes 62, 60 is determined by the location of a ground tap 80 on the secondary winding 64. For example, if the ground tap 80 is connected to the middle coil of the secondary winding 64, then the top and bottom electrodes receive equal amounts of RF power from the RF source 72. On the other hand, if the ground tap 80 is located closer to the connection to the top electrode 62, then more RF power is applied to the bottom electrode 60.

The embodiment of FIG. 3 may be modified so that the top electrode 62 is outside of the chamber 50 and overlies the ceiling 54 (as discussed later herein with reference to FIG. 7).

The connection of the opposing electrodes 60, 62 to opposite 10 ends of the secondary winding 64 establishes a 180-degree out-of-phase relationship between the RF signals imposed on the opposing electrodes 60, 62, thereby maximizing capacitive coupling of RF power to the plasma. However, other suitable RF phase relationships may be chosen in carrying out the invention.

Figure 1:
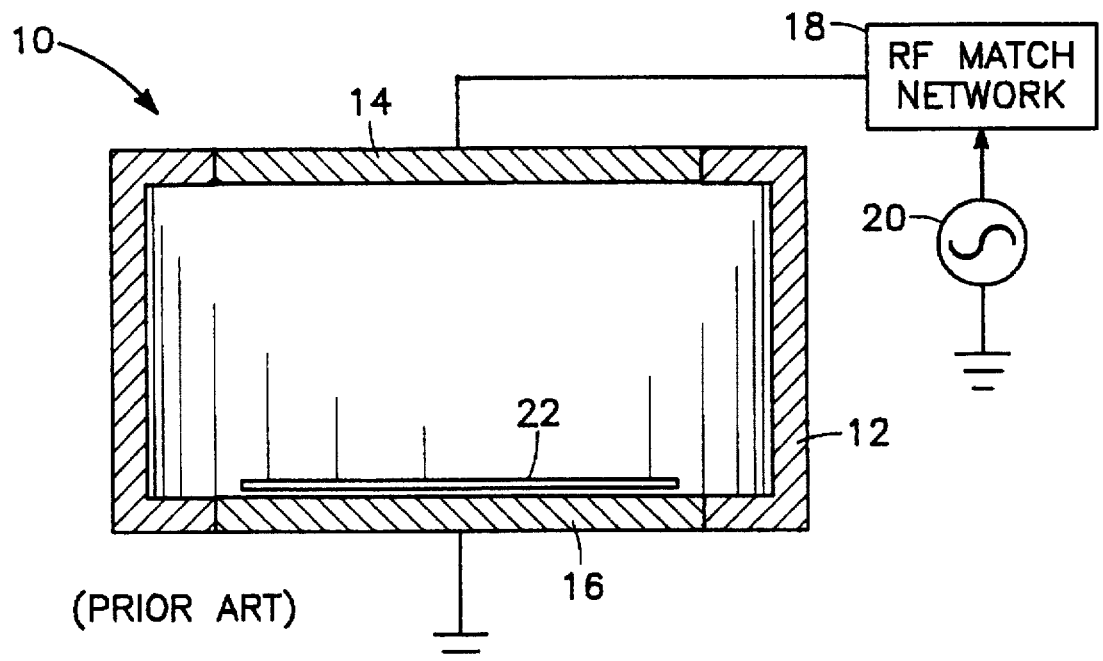
FIG. 1 is a diagram of a capacitively coupled RF plasma reactor of the prior art.
Figure 2:
FIG. 2 is a diagram of an inductively coupled RF plasma reactor of the prior art.

The large closely spaced parallel top and bottom parallel plate capacitive electrodes 60, 62 of the embodiment of FIG. 3 provide all the advantages of the parallel plate plasma reactor of FIG. 1, including greater ease of plasma ignition, better control of plasma ion energy at the wafer surface and better processing reproducibility. The inductive coil 74 provides at the same time all of the advantages of the inductively coupled plasma reactor of FIG. 2, including the ability to provide high plasma ion density without unduly increasing plasma ion energy.

Figure 4:
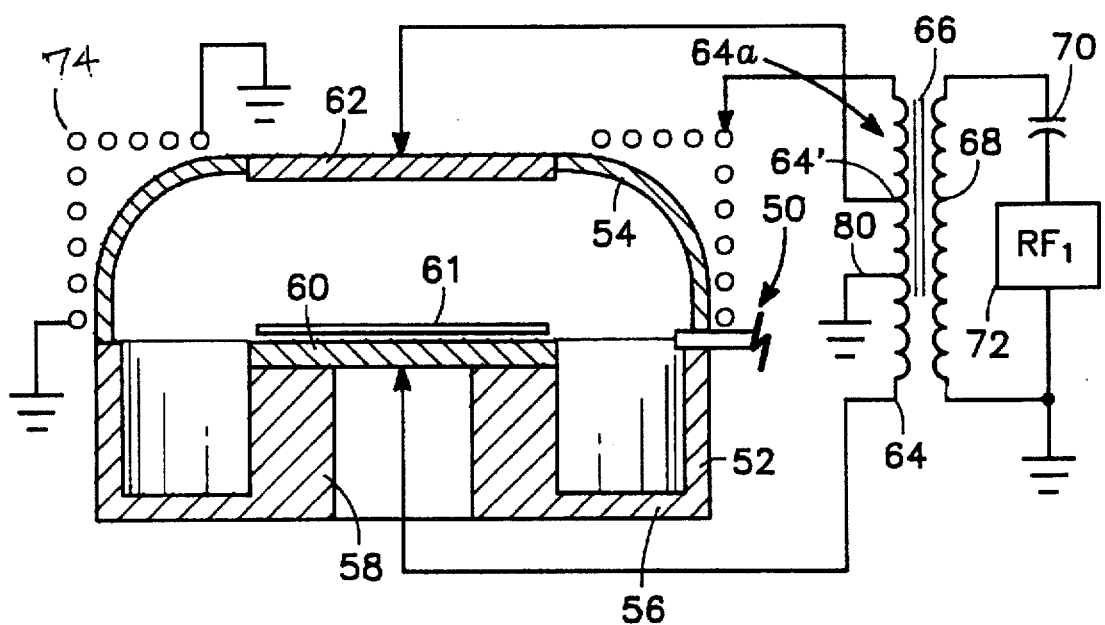
FIG. 4 is a diagram of a second embodiment of the invention.

FIG. 4 illustrates a modification of the embodiment of FIG. 3 including a power splitting feature which reduces the number of required RF sources. Specifically, the second RF source 78 is eliminated and an extended winding portion 64a is added to the secondary winding 64 at its connection 64' to the top electrode 62. The end of the extended portion 64a is connected to the middle winding of the inductor coil 74. While the location of the ground tap 80 determines the apportionment of power between the top and bottom electrodes 62, 60 (as mentioned above with reference to the embodiment of FIG. 3), the location of the connection 64' determines the apportionment of power between the pair of electrodes 60, 62 and the inductive coil 74. For example, if the connection 64' is moved to the end of the extended coil portion 64a where it connects to the inductive coil 74, then the amounts of power applied to the top electrode 62 and to the inductive coil 74 are equal. Moreover, if in the same example the ground tap 80 is located exactly in the middle of the entire secondary winding 64, then the amounts of power applied to the top electrode 62, the bottom electrode 60 and the inductive coil 74 are all equal. Thus, the RF power applied to each of the three RF-powered elements (i.e., the top electrode 62, the bottom electrode 60 and the inductive coil 64) is separately (but not independently) adjustable, a significant advantage.

Figure 5:
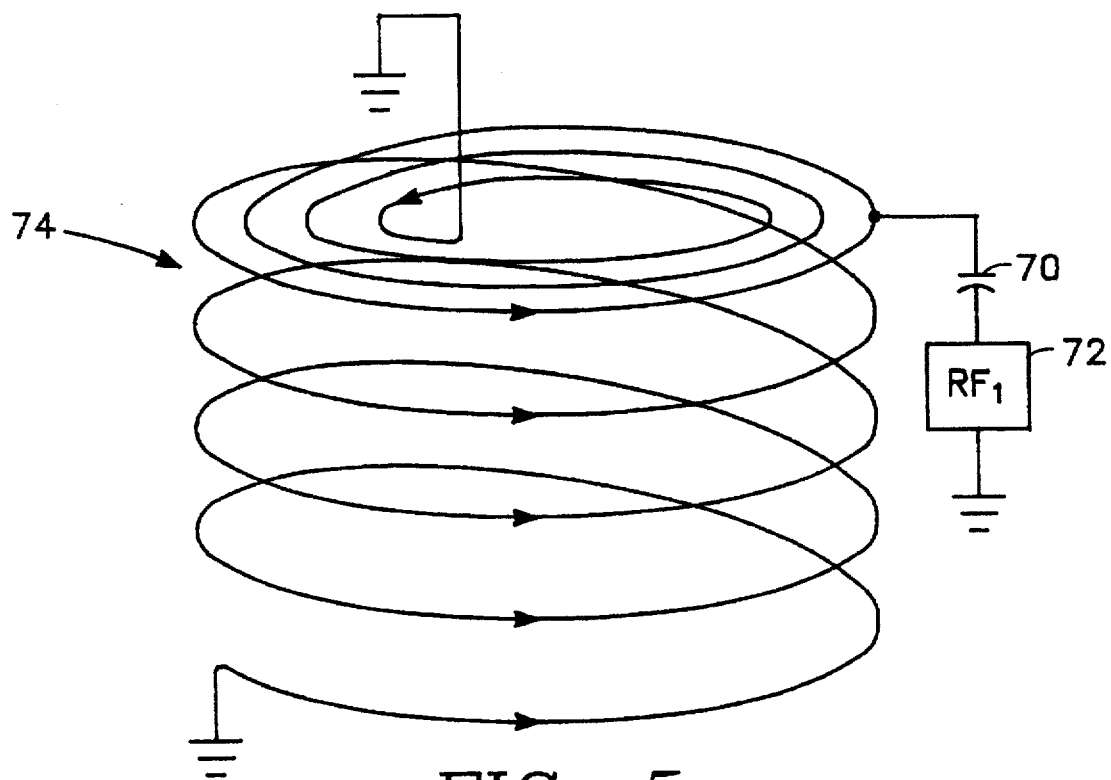
FIG. 5 is a diagram of one embodiment of an inductive coil employed in carrying out the invention.

FIG. 4 also illustrates another aspect of the invention in which the inductive coil 74 is non-conformal with the dome-shaped ceiling. Preferably, the dome-shaped ceiling is a multi-radius dome in which the radius increases toward the apex of the dome, while the inductive coil is a partial cylinder shape, as shown in FIG. 5, including a right cylindrical portion 74a and a flat top portion 74b. Such a non-conformal inductive coil over a multi-radius dome ceiling is disclosed in U.S. patent application Ser. No. 08/389,889 filed Feb. 15, 1995 by Gerald Z. Yin et al., entitled "RF PLASMA WITH HYBRID CONDUCTOR AND MULTI-RADIUS DOME CEILING " and assigned to the present assignee.

Figure 6:
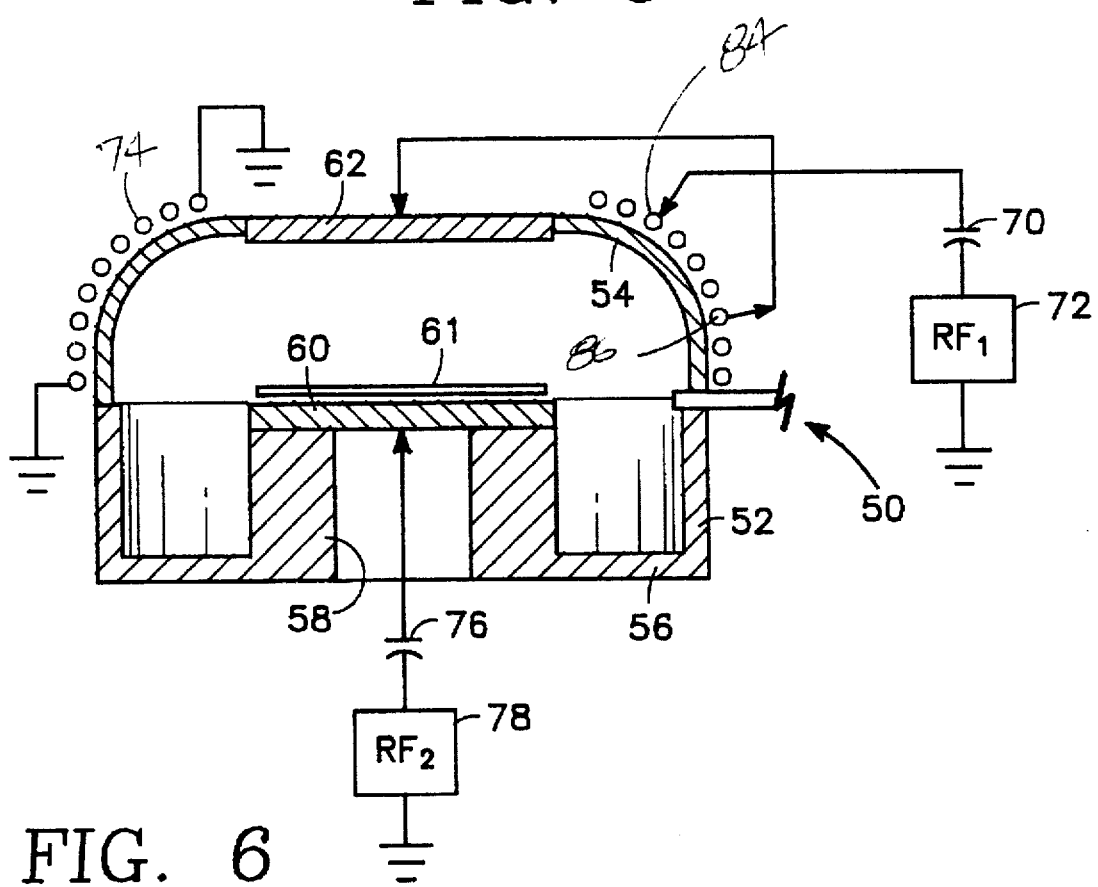
FIG. 6 is a diagram of a third embodiment of the invention.

FIG. 6 illustrates another power splitting embodiment in which the transformer 66 is eliminated and the inductive coil 74 itself is employed to provide RF power splitting to the top electrode 62. As shown in FIG. 6, the RF source 72 is connected through the capacitor 70 to a selected winding 84 of the inductive coil 74. Another selected winding 86 of the inductive coil 74 is connected to the top electrode 62. The second RF source 78 is connected to the bottom electrode 60. Alternatively, the selected winding 86 could instead be connected to the bottom electrode 60 and the second RF source 78 could be connected to the top electrode 62.

Figure 7:
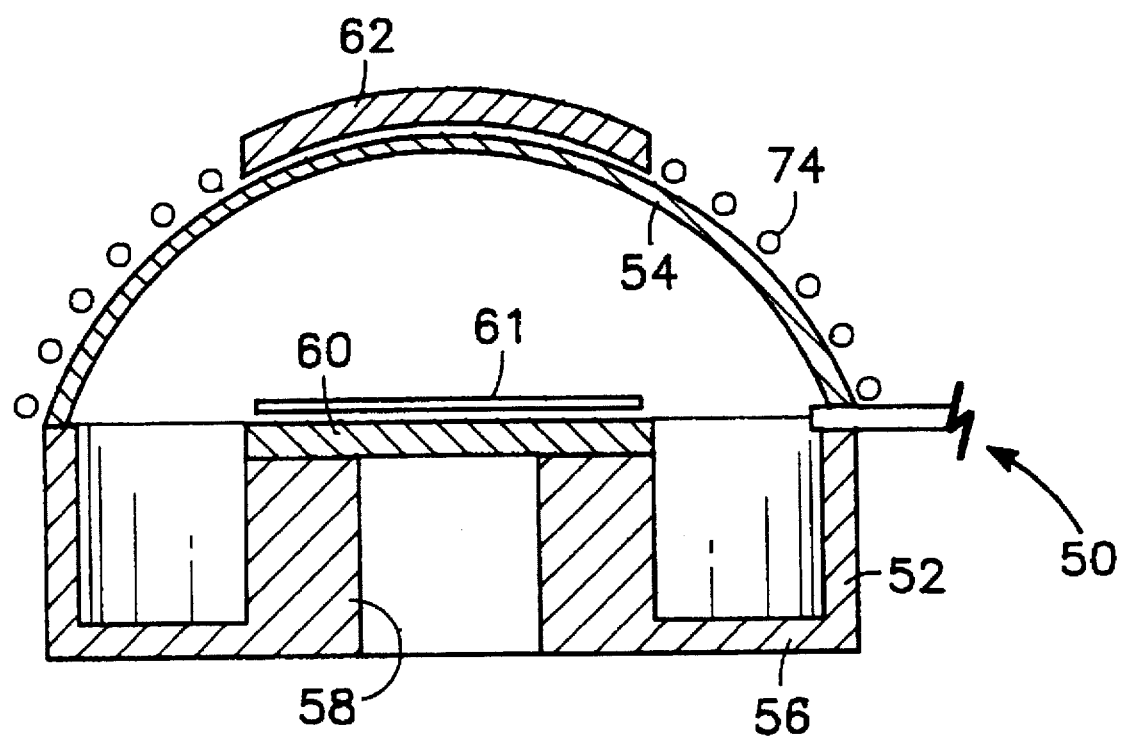
FIG. 7 is a diagram of a fourth embodiment of the invention.

FIG. 7 illustrates an embodiment corresponding to FIG. 4, but in which the top electrode 62 is separate from the ceiling 54 of the chamber 50 and sits on top of the outside surface of the ceiling 54. The top electrode 62 causes a portion of the inside surface of the ceiling 54 in registration with the electrode 62 to be sputtered by the plasma. This feature can serve either one of two purposes. First, any contaminant or plasma processing by-products which may tend to deposit on the inner surface of the ceiling 54 are removed by this sputtering process. Secondly, the ceiling itself may be a processing material which is readily and therefore introduced into the plasma in the chamber, by the action of the top electrode 62. For example, if it is desired to introduce a fluorine scavenger into the chamber, the ceiling 54 may be silicon so that silicon atoms are sputtered from the ceiling 54 into the plasma.

The RF frequency of the RF source (or sources if more than one is employed as in FIGS. 3 or 6) is preferably in a low range such as on the order of about 2.0 MHz or even lower, so that the plasma ions are driven directly by the transit external field rather than the average plasma potential. This choice is preferred because the average plasma potential is floating and is difficult to control. For metal etching, it is preferable to power the bottom electrode 60 (wafer pedestal) from a separate RF source, so that the embodiment of FIG. 6 is preferred.

Figure 8:
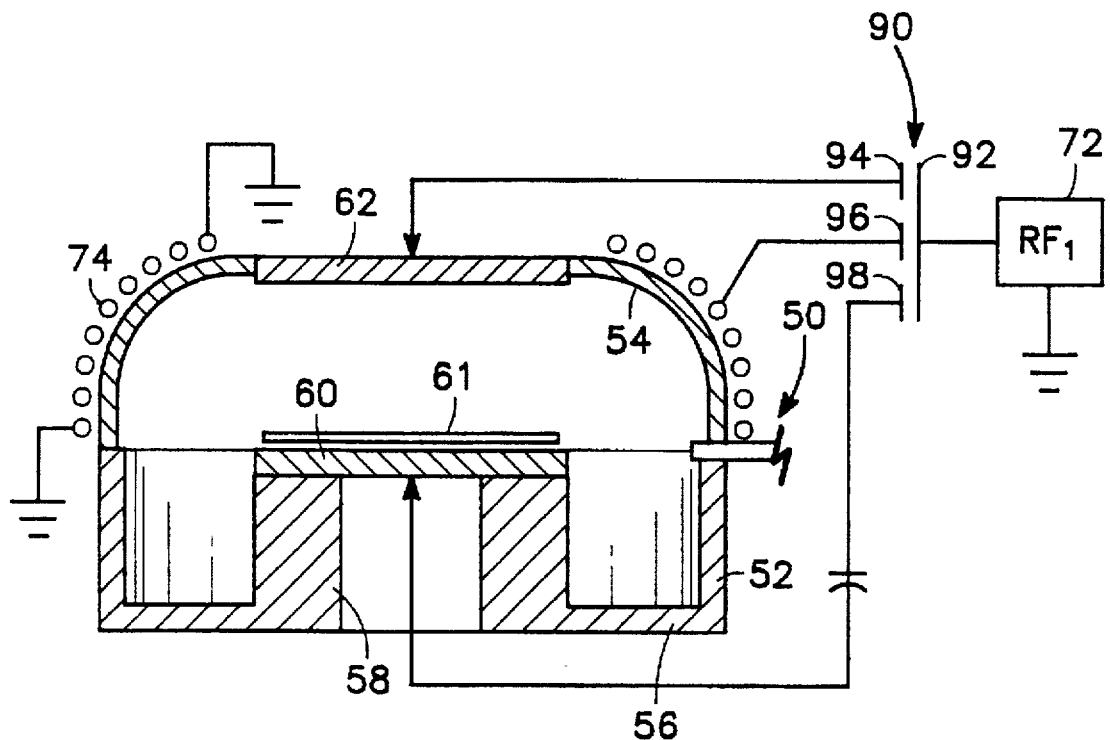
FIG. 8 is a diagram of a fifth embodiment of the invention employing capacitive power splitting.

The embodiments described above with reference to FIGS. 1–7 employ a species of reactive RF power splitting employing an inductive element such as a coil or transformer, and is therefore referred to herein as inductive RF power splitting. FIG. 8 illustrates an embodiment of the invention employing another species of reactive RF power splitting, namely capacitive RF power splitting. In FIG. 8, a power splitting capacitor 90 has a common electrode 92 connected to the common RF source 72 and plural parallel electrodes 94, 96, 98 facing the common electrode 92. The parallel capacitor electrodes 94, 96, 98 are individually connected to the top electrode 62, the coil 74 and the bottom electrode 60, respectively. A phase reversing capacitor 99 is connected in series between the parallel electrode 98 and the bottom electrode 60 if a 180 degree out-of-phase relationship is maintained between the top and bottom electrodes 60, 62 is desired.

Figure 9:
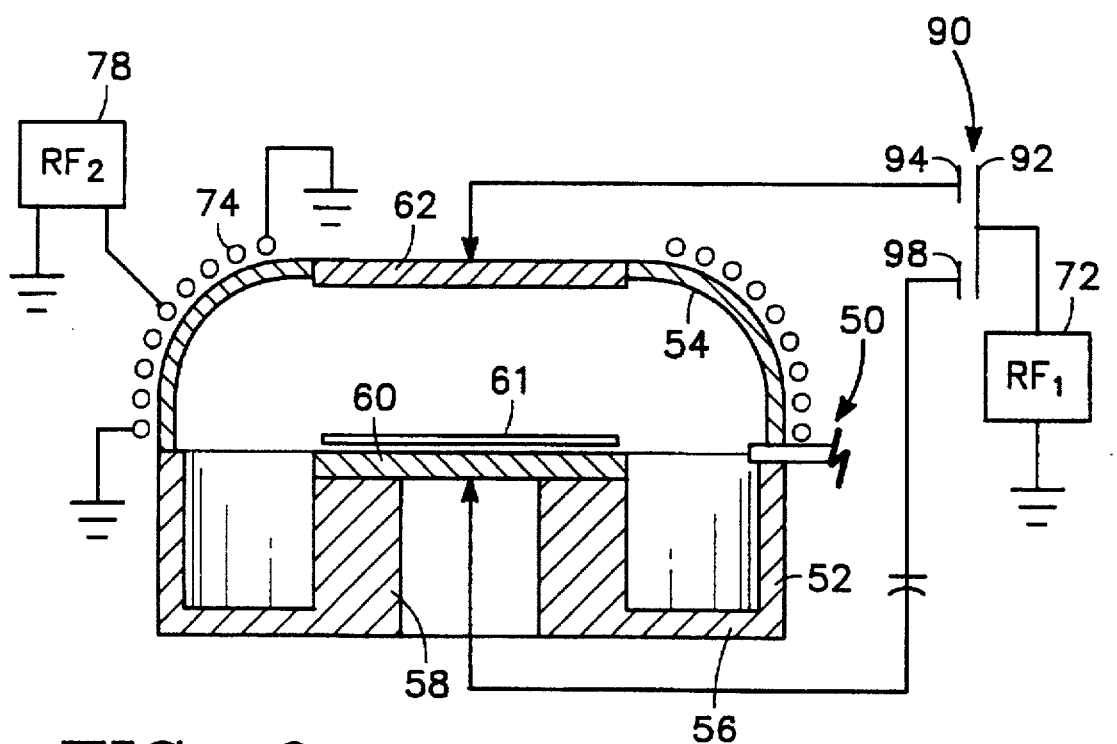
FIG. 9 is a diagram of a sixth embodiment of the invention.

FIG. 9 illustrates how the embodiment of FIG. 8 is modified to eliminate the parallel capacitor electrode 96, so that power splitting is made between the bottom and top electrodes 60, 62 only while the coil 74 is powered as in the embodiment of FIG. 3.

While the invention has been described in detail by specific reference to preferred embodiments thereof, it is understood that variations and modifications may be made without departing from the true spirit and scope of the invention.

What is claimed is:

1. A capacitively and inductively coupled RF plasma reactor for processing a semiconductor wafer inside a vacuum chamber of said reactor, comprising:

a pair of parallel capacitive electrodes facing each other across at least a portion of the chamber;

an inductive coil wound around a portion of the chamber; and a common RF source;

means for reactively splitting RF power among at least two of: (a) a first one of said capacitive electrodes, (b) a second one of said capacitive electrodes and (c) said inductive coil.

2. The reactor of claim 1 wherein said means for reactively splitting RF power comprises:

means for connecting said common RF source to said inductive coil; and a conductive tap on said inductive coil, said conductive tap connected to one of said capacitive electrodes.

3. The reactor of claim 2 wherein the other of said capacitive electrodes is grounded.

4. The reactor of claim 1 wherein said means for reactively splitting RF power comprise a transformer comprising:

a primary winding connected to said common RF source; and a secondary winding having a pair of connections, the pair of electrodes being connected to respective ones of said connections of the secondary winding.

5. The reactor of claim 4 further comprising a second RF source connected to said inductive coil.

6. The reactor of claim 4 wherein said respective connections of said secondary winding are two ends of said secondary winding.

7. The reactor of claim 1 wherein:

said means for reactively splitting RF power comprise a first connection between one winding of said inductive coil and a common RF power source; and a connection between another winding of said inductive coil and at least one of said capacitive electrodes.

8. The reactor of claim 1 wherein the chamber comprises a ceiling and one of said capacitive electrodes is a top electrode adjacent said ceiling, said ceiling comprising a precursor material for a processing gas which is sputtered into the plasma under the influence of said top electrode.

9. The reactor of claim 8 wherein said ceiling comprises a multi-radius dome shape while the inductive coil is one of: (a) conformal with said dome shape and (b) non-conformal with said dome shape.

10. The reactor of claim 8 wherein the other capacitive electrode comprises a wafer pedestal facing said ceiling.

11. The reactor of claim 8 wherein said top capacitive electrode is one of: (a) inside the chamber and (b) outside of said chamber.

12. The reactor of claim 11 wherein said top electrode is an integral part of the ceiling.

13. The reactor of claim 11 wherein said top electrode comprises a conductive layer lying on a top external surface of said ceiling outside of said chamber.

14. The reactor of claim 1 wherein said means for reactively splitting RF power comprises a power splitting capacitor comprising:

a common capacitor electrode connected to a common RF power source;

at least first and second parallel capacitor electrodes facing said common capacitor electrode, said first and second parallel capacitor electrodes being connected to respective ones of said two of said (a) a first one of said capacitive electrodes, (b) a second one of said capacitive electrodes and (c) said inductive coil.

15. The reactor of claim 14 further comprising a phase reversing capacitor connected in series between one of said parallel capacitor electrodes of said power splitting capacitor and one of said capacitive electrodes of said chamber.

16. A capacitively and inductively coupled RF plasma reactor for processing a semiconductor wafer inside a vacuum chamber of said reactor, comprising:

a pair of parallel capacitive electrodes facing each other across at least a portion of the chamber;

an inductive coil wound around a portion of the chamber;

a common RF power source; and a power splitting capacitor configured to reactively split RF power from said common RF power source to at least two of: (a) a first one of said capacitive electrodes, (b) a second one of said capacitive electrodes and (c) said inductive coil.

17. A capacitively and inductively coupled RF plasma reactor for processing a semiconductor wafer inside a vacuum chamber of said reactor, comprising:

a pair of parallel capacitive electrodes facinq each other across at least a portion of the chamber;

an inductive coil wound around a portion of the chamber;

a common RF source; and reactive power splitting device capable of separately providing power from said common RF source to at least said two of (a) a first one of the pair of electrodes, (b) a second one of the pair of electrodes and (c) said inductive coil; wherein RF power is applied to each of the capacitive electrodes for capacitively coupling RF power into the chamber and to said inductive coil for inductively coupling RF power into the chamber in accordance with a certain RF phase relationship between at least two of (a) the first one of the pair of electrodes, (b) the second one of the pair of electrodes and (c) said inductive coil, during processing of the semiconductor wafer for ease of plasma ignition and precise control of plasma ion energy and process reproducibility.

18. The reactor of claim 17 wherein reactive power splitting means comprises a transformer comprising:

a primary winding connected to said common RF source; and a secondary winding having a pair of connections, the pair of electrodes being connected to respective ones of said connections of the secondary winding.

19. The reactor of claim 18 wherein said respective connections of said secondary winding are two ends of said secondary winding.

20. The reactor of claim 18 wherein said reactive power splitting means comprise means for connecting a point on said secondary winding to one of said top and bottom electrodes whereby to split RF power from a common source between said two of (a) a first one of the pair of electrodes, (b) a second one of the pair of electrodes and (c) said inductive coil.

21. A capacitively and inductively coupled RF plasma reactor for processing a semiconductor wafer inside a vacuum chamber of said reactor, comprising:

a pair of parallel capacitive electrodes facing each other across at least a portion of the chamber;

an inductive coil wound around a portion of the chamber;

a common RF power source; and a transformer configured to reactively split RF power from said common RF power source to at least two of: (a) a first one of said capacitive electrodes, (b) a second one of said capacitive electrodes and (c) said inductive coil.

22. The reactor of claim 17 wherein at least a portion of the chamber ceiling comprises a precursor material for a processing gas which is sputtered into the plasma under the influence of said top electrode.

23. The reactor of claim 22 wherein said ceiling comprises a multi-radius dome shape while the inductive coil is one of: (a) conformal with said dome shape and (b) non-conformal with said dome shape.

24. The reactor of claim 22 wherein said bottom capacitive electrode comprises a wafer pedestal.

25. The reactor of claim 22 wherein said top capacitive electrode is one of: (a) inside the chamber and (b) outside of said chamber.

26. The reactor of claim 25 wherein said top electrode is inside the chamber and is an integral part of the ceiling.

27. The reactor of claim 17 wherein said reactive power splitting device comprises a power splitting capacitor comprising:

a common capacitor electrode connected to a common RF power source;

at least first and second parallel capacitor electrodes facing said common capacitor electrode, said first and second parallel capacitor electrodes being connected to respective ones of said two of said (a) a first one of said capacitive electrodes, (b) a second one of said capacitive electrodes and (c) said inductive coil.

28. The reactor of claim 27 further comprising a phase reversing capacitor connected in series between one of said parallel capacitor electrodes of said power splitting capacitor and one of said capacitive electrodes of said chamber.

29. A method of capacitively and inductively coupling RF power into a vacuum chamber of a plasma reactor used for processing a semiconductor wafer so as to ignite and control a plasma within the vacuum chamber, said method comprising the steps of:

configuring the plasma reactor to comprise a pair of parallel capacitive electrodes facing each other across at least a portion of the chamber;

configuring the plasma reactor to comprise an inductive coil wound around a portion of the chamber;

applying RF Dower to each of the capacitive electrodes to capacitively couple RF power into the chamber and to said inductive coil to inductively couple RF power into the chamber during processing of the semiconductor wafer, said step of applying RF power to each of the capacitive electrodes facilitating plasma ignition and precise control of plasma ion energy and said step of applying RF power to said inductor coil facilitating precise control of plasma ion density; and configuring the plasma reactor to comprise a chamber ceiling having at least a portion comprising a precursor material for a processing gas which is sputtered into the plasma under the influence of a first one of said electrodes.

30. A capacitively and inductively coupled RF plasma reactor for processing a semiconductor wafer inside a vacuum chamber of said reactor, comprising:

a pair of parallel capacitive electrodes facing each other across at least a portion of the chamber;

an inductive coil wound around a portion of the chamber;

a common RF source; and reactive power splitting device capable of separately providing power from said common RF source to at least said two of (a) a first one of the pair of electrodes, (b) a second one of the pair of electrodes and (c) said inductive coil; wherein RF power is applied to each of the capacitive electrodes for capacitively coupling RF power into the chamber and to said inductive coil for inductively coupling RF power into the chamber during processing of the semiconductor wafer for ease of plasma ignition and precise control of plasma ion energy and density.

31. A capacitively and inductively coupled RF plasma reactor for processing a semiconductor wafer inside a vacuum chamber of said reactor, comprising:

a pair of parallel capacitive electrodes facing each other across at least A portion of the chamber;

an inductive coil wound around a portion of the chamber; and a power applying device capable of applying RF power to each of the capacitive electrodes for capacitively coupling RF power into the chamber and to said inductive coil for inductively coupling RF power into the chamber during processing of the semiconductor wafer for ease of plasma ignition and precise control of plasma ion energy and density; wherein at least a portion of a ceiling of said chamber comprises a precursor material for a processing gas which is sputtered into the plasma under the influence of a first one of said electrodes.

* * * * *